United States Patent
Kim et al.

(10) Patent No.: US 7,683,539 B2
(45) Date of Patent: Mar. 23, 2010

(54) LIGHT EMITTING DEVICE PACKAGE AND METHOD FOR MANUFACTURING THE SAME

(75) Inventors: Geun ho Kim, Seoul (KR); Seung yeob Lee, Seongnam-si (KR)

(73) Assignees: LG Electronics Inc., Seoul (KR); LG Innotek Co., Ltd., Seoul (KR)

( * ) Notice: Subject to any disclaimer, the term of this patent is extended or adjusted under 35 U.S.C. 154(b) by 925 days.

(21) Appl. No.: 11/434,507

(22) Filed: May 16, 2006

(65) Prior Publication Data

US 2006/0261292 A1 Nov. 23, 2006

(30) Foreign Application Priority Data

May 17, 2005 (KR) ...................... 10-2005-0041235

(51) Int. Cl.
*H01J 1/62* (2006.01)
*H01J 9/00* (2006.01)

(52) U.S. Cl. .................... 313/512; 313/498; 445/24

(58) Field of Classification Search ......... 313/498–512; 257/89, 99–100; 445/24–25
See application file for complete search history.

(56) References Cited

U.S. PATENT DOCUMENTS

| | | | |
|---|---|---|---|
| 4,936,808 A | | 6/1990 | Lee |
| 5,243,200 A | * | 9/1993 | Kawasaki et al. ............. 257/99 |
| 5,798,536 A | * | 8/1998 | Tsutsui ........................ 257/99 |
| 7,151,283 B2 | * | 12/2006 | Reeh et al. ..................... 257/98 |
| 7,252,408 B2 | * | 8/2007 | Mazzochette et al. ....... 362/294 |
| 2002/0171090 A1 | * | 11/2002 | Oohata et al. ................. 257/88 |
| 2003/0017297 A1 | * | 1/2003 | Song et al. .................... 428/68 |

FOREIGN PATENT DOCUMENTS

| | | |
|---|---|---|
| CN | 1477721 | 2/2004 |
| JP | 2002-344011 | 11/2002 |
| JP | 2005-057239 | 3/2005 |

* cited by examiner

*Primary Examiner*—Nimeshkumar D Patel
*Assistant Examiner*—Anne M Hines
(74) *Attorney, Agent, or Firm*—McKenna Long & Aldridge LLP (57) ABSTRACT

The present invention relates to a light emitting device package and a method for manufacturing the same. The present invention has advantages in that a light emitting device is electrically connected to other devices without use of wire bonding, thereby saving a space for wire bonding and reducing the size of a package.

17 Claims, 11 Drawing Sheets

LIGHT EMITTING DEVICE PACKAGE AND METHOD FOR MANUFACTURING THE SAME

This application claims the benefit of Korean Application No. 2005-0041235, filed on May 17, 2005, which is hereby incorporated by reference as if fully set forth herein.

BACKGROUND

The present invention relates to a light emitting device package and a method for manufacturing the same.

In general, a light emitting device basically comprises a junction of p-type and n-type semiconductors, and is a kind of optoelectronic device in which upon application of a voltage thereto, energy corresponding to a bandgap of a semiconductor is emitted in the form of light due to combination of electrons and holes.

The amount of light outputted from the light emitting device increases in proportion to an electric current flowing through the device.

Studies on such a light emitting device has been actively conducted as power consumption is low, harmful substances are not used, color reproducibility is good and a life span is extended as long as tens of thousands hours or more.

A light emitting device such as a light emitting diode (LED) or laser diode using a III-V group or II-VI group compound semiconductor material of a direct transition type semiconductor can implement red, green, blue colors and ultraviolet rays by means of a thin film growth technique and development of a device material.

Further, the light emitting device can implement a white light source with superior efficiency by using a fluorescent substance or by combining light.

With the development of such techniques, the light emitting device has been used not only in a device for a display but in a variety of fields such as a transmitting module, a backlight of a liquid crystal display (LCD), a lighting system capable of substituting for a fluorescent lamp or incandescent bulb, a sign board, a traffic light, and an instrument panel of a car.

Meanwhile, if a substrate is n-type in a red or infrared light emitting device, an n-type layer, an active layer and a p-type layer are sequentially laminated on a top surface of the substrate, an n-type electrode layer is formed beneath a bottom surface of the substrate, and a p-type electrode layer is formed on a top surface of the p-type layer.

If a forward voltage is applied between the n-type and p-type electrode layers in the red light emitting device, electrons are injected into the active layer through the n-type layer and holes are injected into the active layer through the p-type layer.

At this time, the electrons and the holes injected into the active layer are recombined and then emit light corresponding to a bandgap or an energy level difference of the active layer.

As described above, the red or infrared light emitting device is provided with a structure where the p-type and n-type electrode layers face each other with the substrate there between.

Accordingly, at least one electrode should be subjected to wire bonding in the prior art so that the red or infrared light emitting device can come into contact with a submount or a printed circuit board (PCB) and can be electrically connected to other devices.

Therefore, a certain space for wire bonding to the submount or the PCB should be provided. This causes increase in the size of a package, and reduction in reliability of the package due to short or disconnection of a wire.

Such a prior art will be described with reference to FIG. 1.

Figure 1:
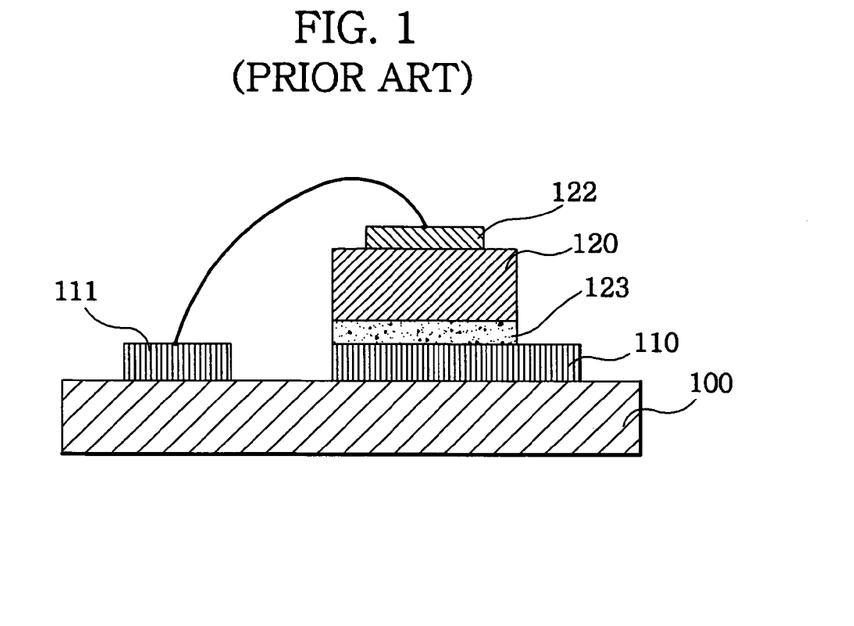
FIG. 1 is a sectional view of a conventional light emitting device package using wire bonding.

FIG. 1 is a sectional view of a conventional light emitting device package using wire bonding. First and second conductive pads (110, 111) are formed on a top surface of a substrate (100) while being spaced apart from each other.

Further, a second electrode layer (123) formed beneath a bottom surface of a light emitting device (120) is bonded to a top surface of the first conductive pad (110), and a first electrode layer (122) formed on a top surface of the light emitting device (120) and the second conductive pad (111) are wire bonded for electrical connection there between.

A submount made of silicone (Si) or ceramic, or a PCB is used for the substrate (100).

The first conductive pad (110) is formed on the top surface of the substrate (100).

Further, the first conductive pad (110) has the same polarity as that of the second electrode layer (123) formed beneath the bottom surface of the light emitting device (120).

For example, if the second electrode layer (123) formed beneath the bottom surface of the light emitting device (120) is n-type, the first conductive pad (110) is also n-type. If the second electrode layer (123) formed beneath the bottom surface of the light emitting device (120) is p-type, the first conductive pad (110) is also p-type.

The second conductive pad (111) is formed on the top surface of the substrate (100) such that it is spaced apart from the first conductive pad (110).

The light emitting device (120) is bonded to the top surface of the first conductive pad (110).

Figure 2:
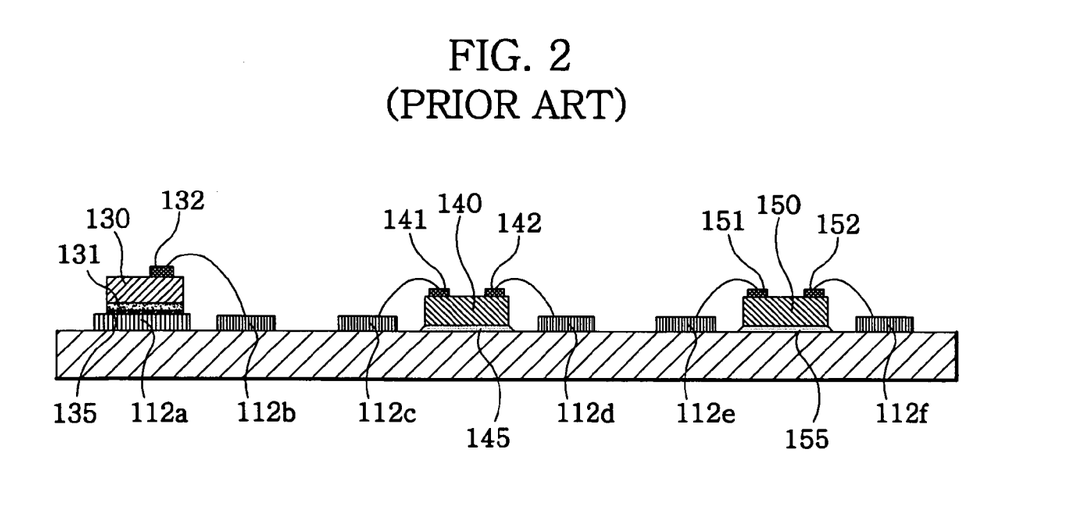
FIG. 2 is a sectional view showing a state where light emitting devices are arrayed and packaged according to a prior art.

FIG. 2 is a sectional view showing a state where light emitting devices are arrayed and packaged according to a prior art. A plurality of conductive pads (112a, 112b, 112c, 112d, 112e, 112f) is formed on a substrate (100) of the light emitting device package.

In addition, a lower electrode (131) of a red light emitting device (130) is bonded to a top surface of the conductive pad (112a) with a conductive adhesive (135), and an upper electrode (132) of the red light emitting device (130) is wire bonded to another conductive pad (112b).

Further, a green light emitting device (140) is bonded to the substrate (100) with an adhesive (145), and two upper electrodes (141, 142) of the green light emitting device (140) are respectively wire bonded to the two conductive pads (112c, 112d).

Furthermore, a blue light emitting device (150) is bonded to the substrate (100) with an adhesive (155), and two upper electrodes (151, 152) of the blue light emitting device (150) are respectively wire bonded to the two conductive pads (112e, 112f).

Such a light emitting device package mounts red, green and blue light emitting devices on a substrate to implement a package emitting white light. At this time, wire bonding is performed several times.

As described above, there is a disadvantage in that a space for wire-bonding a light emitting device is additionally required in the conventional light emitting device, resulting in increase in the size of a package.

Further, since a bonded wire may be short-circuited or disconnected, reliability for connection between devices suffers.

Furthermore, the wire bonding is not suitable for mass production.

Meanwhile, roughly two methods can be used to fabricate a white light emitting diode. First, there is a single chip-type method in which a fluorescent substance is combined on a blue or UV LED chip to obtain white light. Second is a multi chip-type method in which two or three LED chips are combined with each other to obtain white light. At this time, if where the single chip type method is used, it is essentially required to apply a phosphor on a fabricated LED.

Figure 3A:
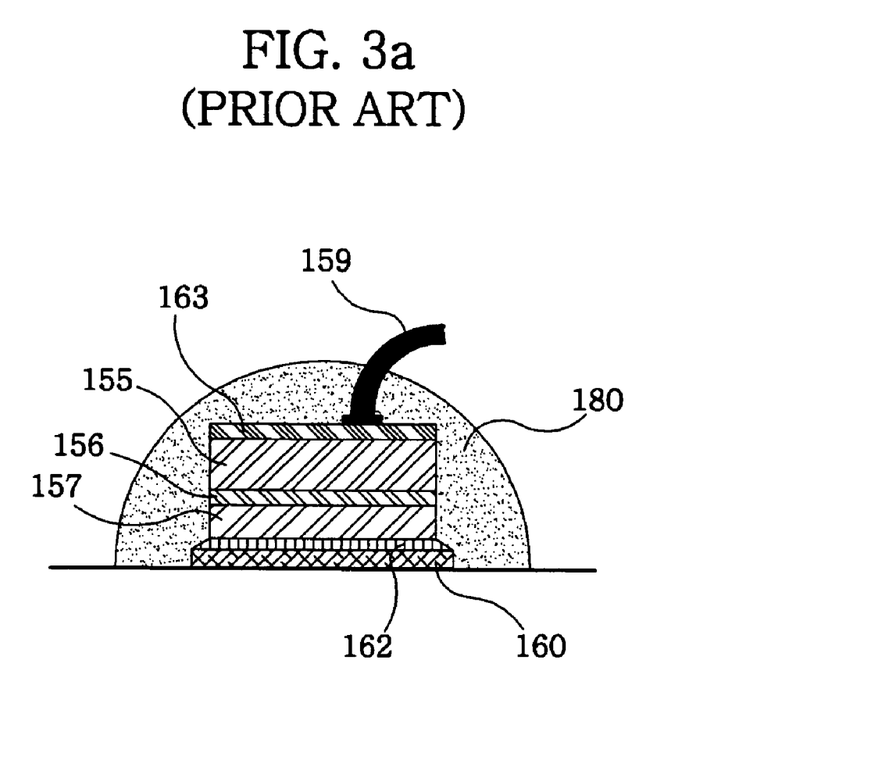
FIGS. 3a and 3b are sectional views schematically showing a state where a phosphor is applied to a conventional light emitting device package.
Figure 3B:
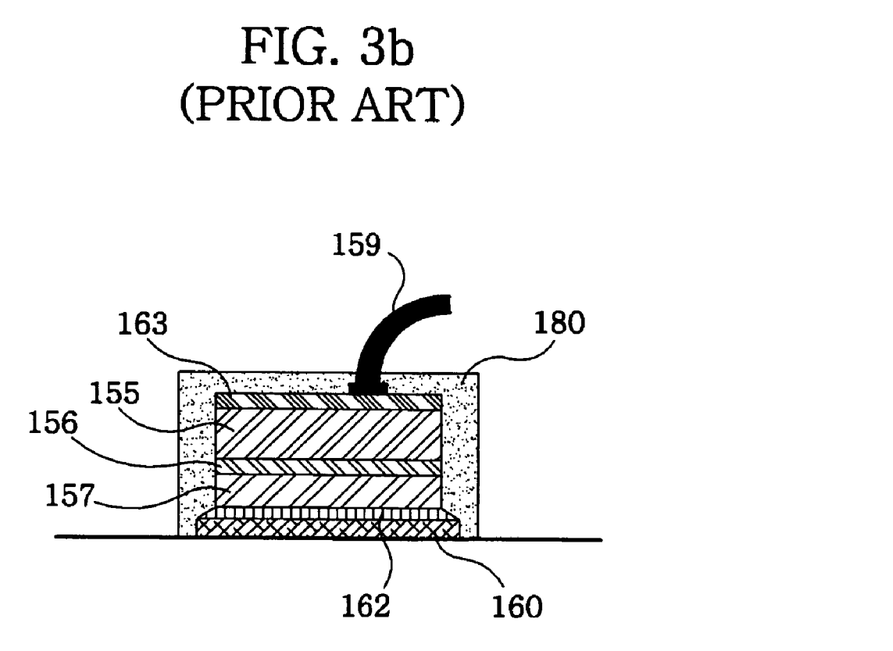

FIGS. 3a and 3b are sectional views schematically showing a state where a phosphor is applied to a conventional light emitting device package. An LED having a p-type layer (157), an active layer (156) and an n-type layer (155), which are sequentially laminated one above another, is joined to a submount (160) with a p-ohmic contact metal layer (162) interposed therebetween, and an n-ohmic contact metal layer (163) is formed on the n-type layer (155).

Here, a wire (159) through which a current is supplied to the LED is bonded to the n-ohmic contact metal layer (163).

At this time, a phosphor is applied to surround the LED and a portion of the wire (159) as shown in FIGS. 3a and 3b.

Generally, in order to form a phosphor thin film, it is preferred that there be no convex or concave portion on a top surface of a device to which the phosphor is to be applied. However, since the wire is bonded to the top of the LED in the conventional light emitting device package shown in FIGS. 3a and 3b, it is not easy to apply the phosphor without damaging the wire.

Further, to perform the wire bonding, a device is fabricated considering a pattern area of a bonding pad. However, if a wire bonding portion comprising the bonding pad and the wire is placed on the top of the LED, a disadvantage occurs that it partially conceals a vertical light emitting area.

That is, although an area of about $0.1 \times 0.1$ mm$^2$ is required for wire bonding, the wire bonding portion conceals 1/9 of a light emitting area in a chip of $0.3 \times 0.3$ mm$^2$.

Further, tendency is that, in manufacturing a high-performance LED its entire area comes to be larger, and if necessary, the number of ohmic metal pads may be increased to reduce electrical resistance.

Since a high-performance LED is operated with a high current, it will be apparent that serial resistance should be reduced to prevent heat accumulation. Further, an ohmic contact metal is made thicker to reduce a voltage drop there by enhancing the light extraction efficiency.

However, since there is limitation on deposit of a thick metal and the area of a wire bonding pad positioned on the top of an LED should be increased to prevent deterioration of the performance of the LED due to a voltage drop within the ohmic contact metal, a vertical light emitting area of the LED inevitably decreases.

SUMMARY OF THE INVENTION

The present invention is conceived to solve the aforementioned problems. Accordingly, an object of the present invention is to provide a light emitting device package and a method for manufacturing the same, wherein a light emitting device is electrically connected to other devices without use of wire bonding so that a space for the wire bonding can be decreased to reduce the size of a package, and a short-circuit or disconnection caused by the wire bonding can be reduced to improve reliability of the package.

Another object of the present invention is to provide a light emitting device package and a method for manufacturing the same, wherein a light transmitting material film is coated on a substrate with a light emitting device mounted thereon so that an additional passivation film capable of protecting the light emitting device can be dispensed, and wire bonding is not required to enable reduced manufacturing costs and mass production.

A further object of the present invention is to provide a light emitting device package and a method for manufacturing the same, wherein a conductive interconnection portion is used without a wire at a light emitting device so that uniform application of a phosphor can be easily made and an area absorbing vertically emitted light can be reduced to improve light extraction of the device.

According to a first preferred aspect of the present invention for achieving the object, there is provided a light emitting device package, comprising: a substrate with a conductive pad formed thereon; a light emitting device mounted on the substrate and having an electrode pad formed on at least one of the top and bottom of the light emitting device; a light transmitting material film for surrounding the conductive pad and the light emitting device while exposing a portion of each of the conductive pad and the electrode pad formed on the at least one of the top and bottom of the light emitting device; and a conductive line formed along a surface of the light transmitting material film from the exposed portion of the conductive pad to the exposed portion of the electrode pad of the light emitting device.

According to a second preferred aspect of the present invention for achieving the object, there is provided a light emitting device package, comprising: a substrate with a pair of conductive pads formed thereon; a light emitting device mounted on the substrate and having a pair of electrode pads formed on the top of the light emitting device; a light transmitting material film for surrounding the conductive pads and the light emitting device while exposing a portion of each of the pair of conductive pads and a portion of each of the pair of electrode pads; and a pair of conductive lines formed along a surface of the light transmitting material film from the exposed portion of each of the pair of conductive pads to the exposed portion of each of the pair of electrode pads.

According to a third preferred aspect of the present invention for achieving the object, there is provided a method for manufacturing a light emitting device package, comprising: mounting a light emitting device having an electrode pad formed on at least one of the top and bottom of the light emitting device on a substrate with a conductive pad formed thereon; forming a light transmitting material film for surrounding the conductive pad and the light emitting device while exposing a portion of each of the conductive pad and the electrode pad formed on the at least one of the top and bottom of the light emitting device; and forming a conductive line formed along a surface of the light transmitting material film from the exposed portion of the conductive pad to the exposed portion of the electrode pad of the light emitting device.

According to a fourth preferred aspect of the present invention for achieving the object, there is provided a method for manufacturing a light emitting device package, comprising: bonding a light emitting device formed with a pair of electrode pads to a substrate with a pair of conductive pads formed thereon; forming a light transmitting material film for surrounding the conductive pads and the light emitting device while exposing a portion of each of the pair of conductive pads and a portion of each of the pair of electrode pads; and forming a pair of conductive lines formed along a surface of the light transmitting material film from the exposed portion of each of the pair of conductive pads to the exposed portion of each of the pair of electrode pads.

BRIEF DESCRIPTION OF THE DRAWINGS

The above and other objects, features and advantages of the present invention will become apparent from the following description of preferred embodiments given in conjunction with the accompanying drawings, in which.

DETAILED DESCRIPTION OF THE PREFERRED EMBODIMENTS

Hereinafter, preferred embodiments of the present invention will be described in detail with reference to the accompanying drawings.

Figure 4:
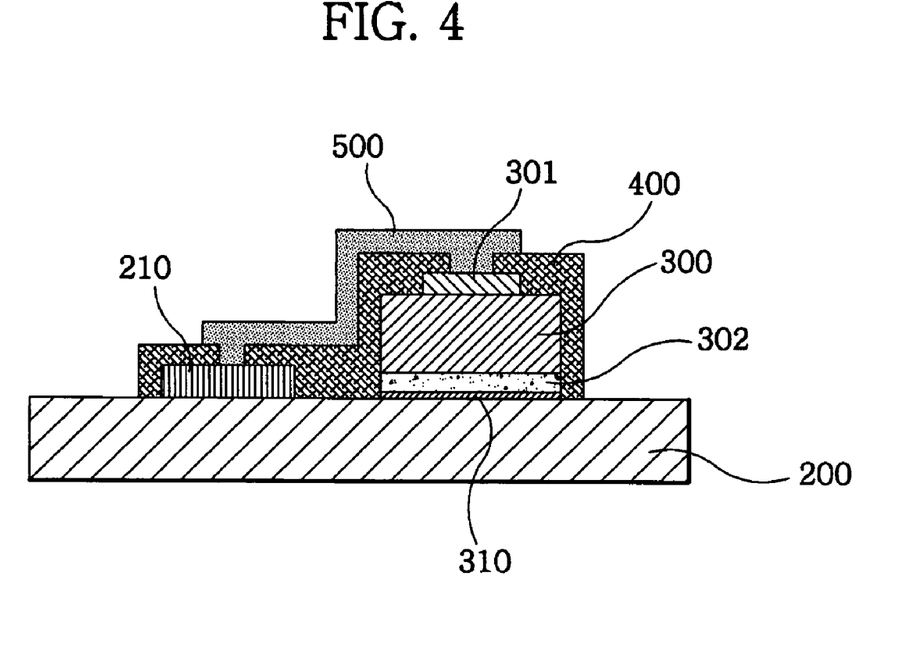
FIG. 4 is a schematic sectional view of a light emitting device package according to a first embodiment of the present invention.

FIG. 4 is a schematic sectional view of a light emitting device package according to a first embodiment of the present invention. The light emitting device package comprises: a substrate (200) with a conductive pad (210) formed thereon; a light emitting device (300) that is mounted on the substrate (200) and has electrode pads (301, 302) respectively formed on the top and bottom of the light emitting device (300); a light transmitting material film (400) surrounding the conductive pad (210) and the light emitting device (300) while exposing a portion of each of the conductive pad (210) and the electrode pad (301) formed on the top of the light emitting device (300); and a conductive line (500) formed along a surface of the light transmitting material film (400) from the exposed portion of the conductive pad (210) to the exposed portion of the light emitting device (300).

Here, it is preferred that the light transmitting material film (400) be made of a photosensitive material through which light can be transmitted.

Preferably, the photosensitive material is a photosensitive material that can transmit almost all the light there through without absorbing red or infrared rays and is SU-8 polymer with superior thermal and chemical resistances.

Further, a phosphor capable of performing wavelength conversion of light emitted from the light emitting device (300) may be dispersed in the light transmitting material film (400).

In this case, light that is emitted from the light emitting device (300) and subjected to the wavelength conversion by the phosphor is mixed in color, thereby implanting a white light source.

Further, it is preferred that the light emitting device (300) having electrode pads (301, 302) respectively formed on the top and bottom thereof be a red or infrared light emitting device.

Meanwhile, the light emitting device (300) is mounted on the substrate (200) using an adhesive (310). The adhesive 310 is preferably a conductive paste or solder metal.

In addition, the substrate (200) comprises a semiconductor substrate made of a semiconductor such as silicone, a non-conductive substrate, or a conductive substrate made of a conductive material such as metal.

Further, it is preferred that the light emitting device (300) be a light emitting diode (LED) comprising a semiconductor layer with a first polarity, an active layer, and a semiconductor layer with a polarity opposite to the first polarity.

Furthermore, the light transmitting material film (400) exposes a portion of each of the conductive pad (210) and the electrode pad (301) formed on the top of the light emitting device (300). As shown in FIG. 4, the light transmitting material film (400) may be formed as a structure completely surrounding the conductive pad (210) and the light emitting device (300) or formed only in regions located along the shortest distance from the conductive pad (210) to the electrode pad (301).

Since both cases have their own advantage, the light transmitting material film may be freely designed.

Moreover, it is also preferred that the light transmitting material film (400) be formed on a portion of the light emitting device (300) and a phosphor film surrounding the light transmitting material film (400) and the light emitting device (300) be further provided.

Figure 5:
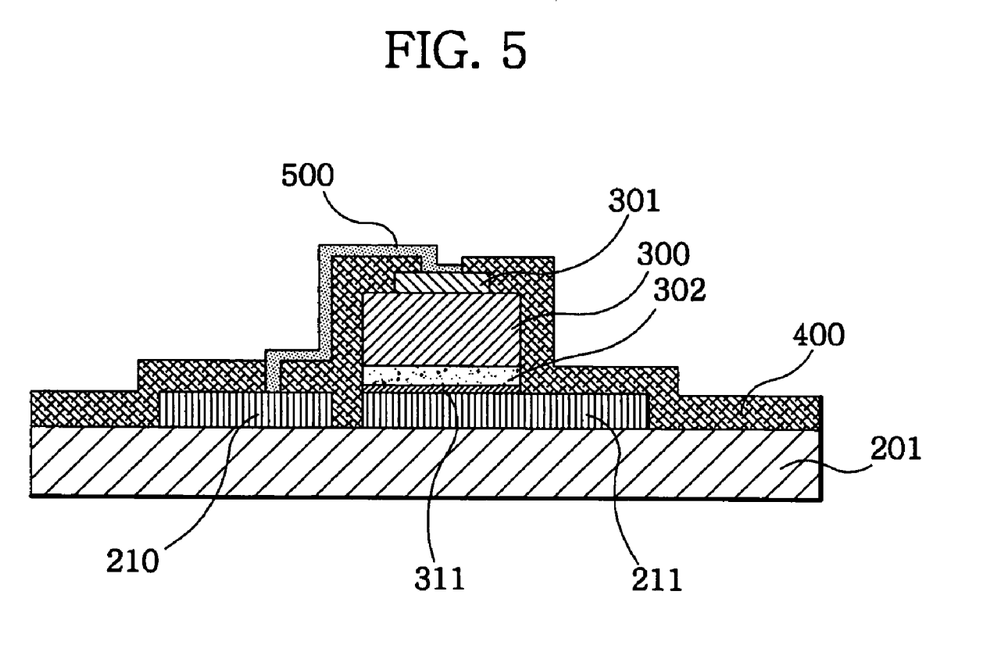
FIG. 5 is a sectional view of a light emitting device package having a non-conductive substrate applied thereto in accordance with the first embodiment of the present invention.

FIG. 5 is a sectional view of a light emitting device package having a non-conductive substrate applied thereto in accordance with the first embodiment of the present invention. If the substrate used in the structure of FIG. 4 is substituted with a non-conductive substrate (201) as shown in FIG. 5, the light emitting device package has a structure in which another conductive pad (211) is formed on an upper region of the non-conductive substrate (201) spaced apart from a conductive pad (210) connected to an electrode pad (301) of a light emitting device (300) through a conductive line (500), and an electrode pad (302) formed beneath the light emitting device (300) is bonded to the other conductive pad (211) using a conductive adhesive (311).

Figure 6:
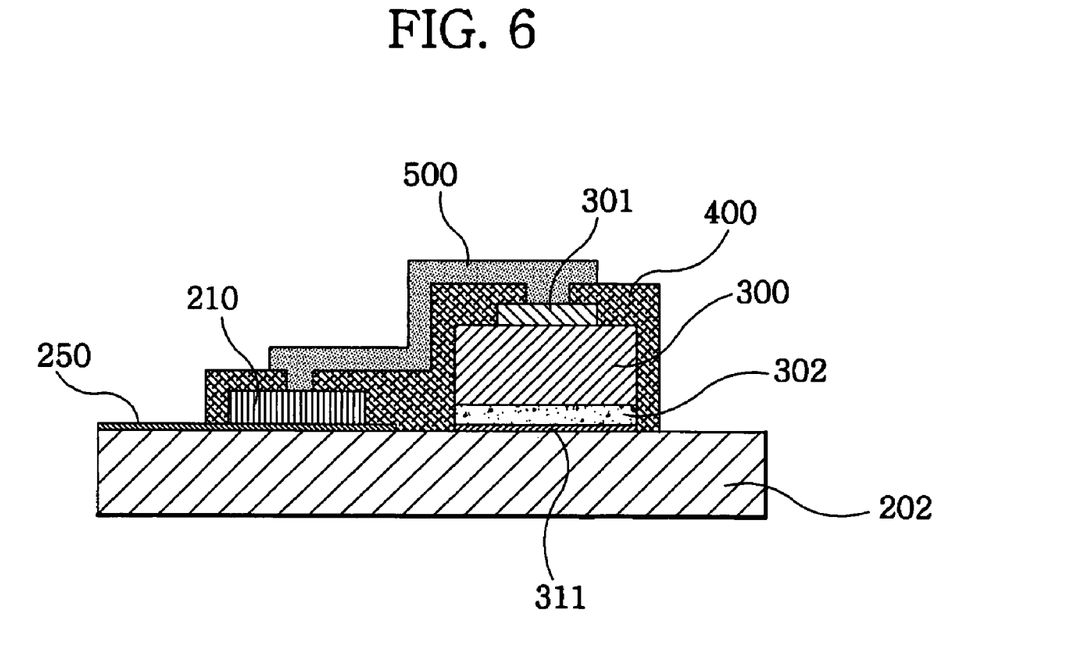
FIG. 6 is a sectional view of a light emitting device package having a conductive substrate applied thereto in accordance with the first embodiment of the present invention.

FIG. 6 is a sectional view of a light emitting device package having a conductive substrate applied thereto in accordance with the first embodiment of the present invention. If the substrate used in the structure of FIG. 4 is substituted with a conductive substrate (202), the light emitting device package has a structure in which an insulation film (250) is interposed between the conductive substrate (202) and a conductive pad (210) connected to an electrode pad (301) of a light emitting device (300) through a conductive line (500), and an electrode pad (302) formed beneath the light emitting device (300) is bonded to the conductive substrate (202) using a conductive adhesive (311).

Figure 7A:
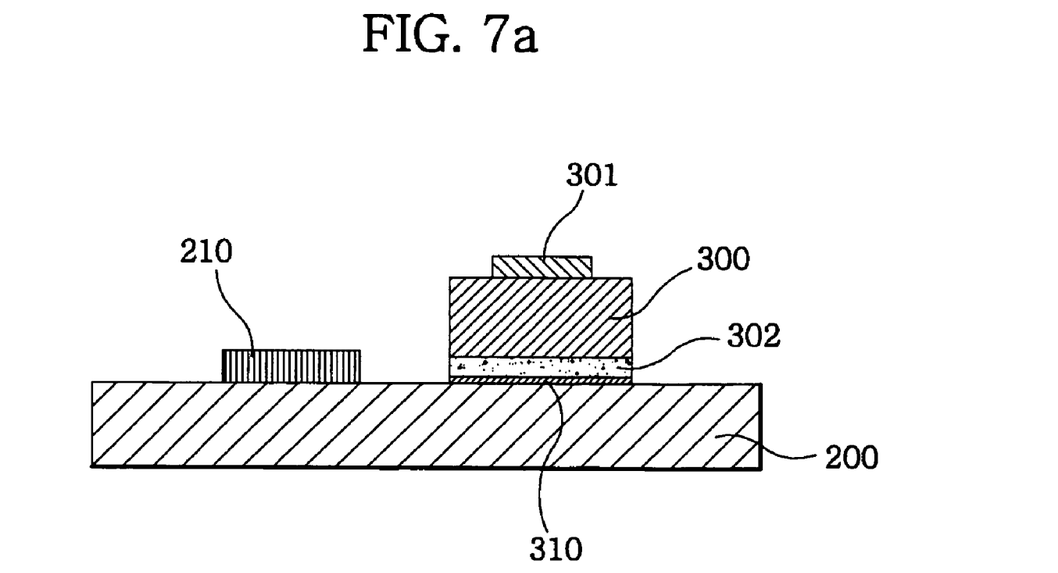
FIGS. 7a to 7c are sectional views illustrating a process of manufacturing the light emitting device package according to the first embodiment of the present invention.
Figure 7B:
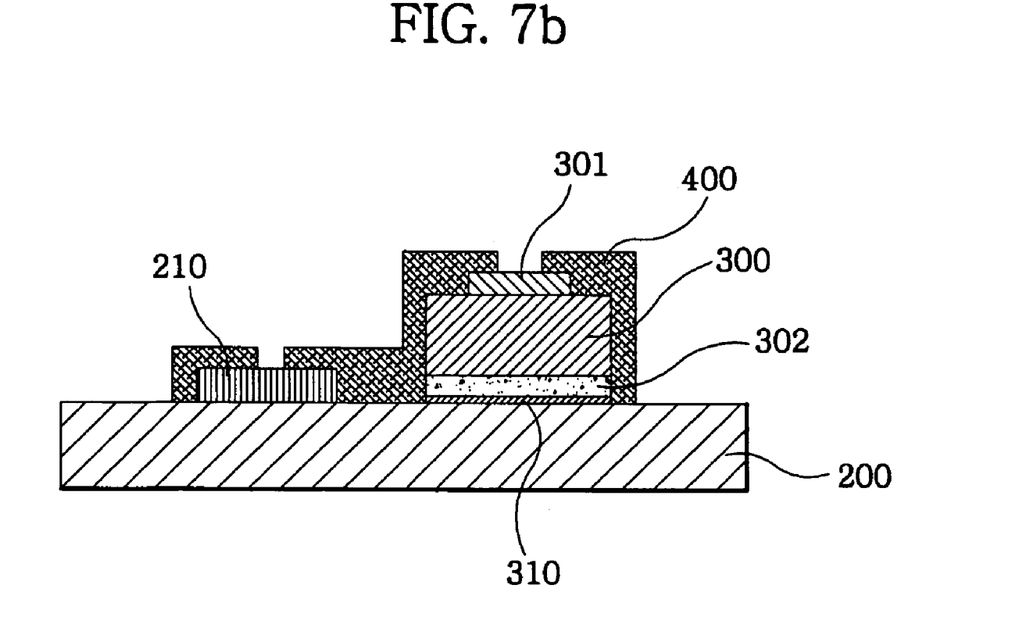
Figure 7C:
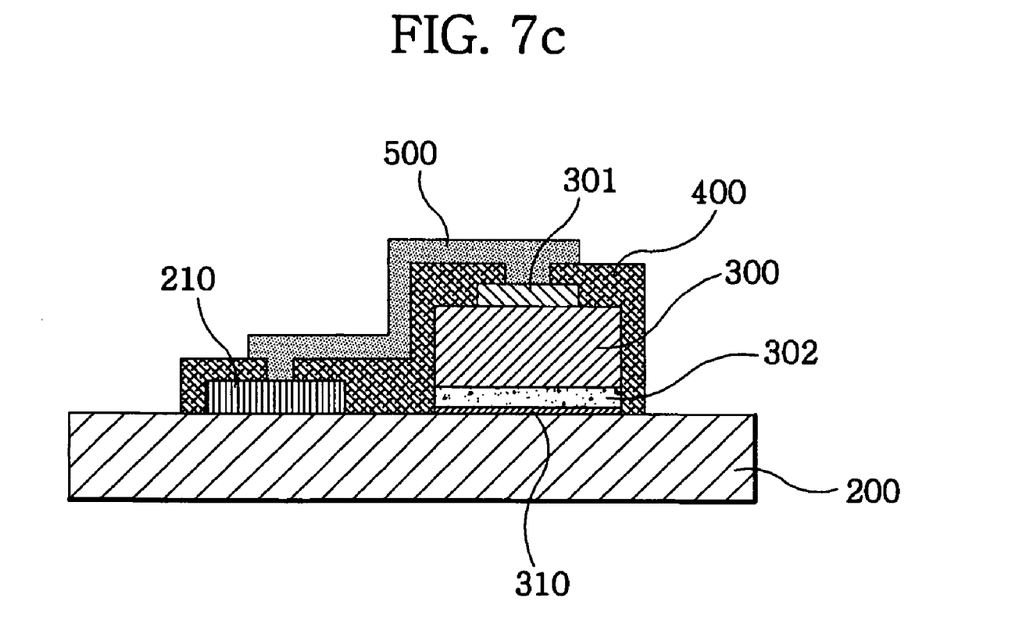

FIGS. 7a to 7c are sectional views illustrating a process of manufacturing the light emitting device package according to the first embodiment of the present invention. First, a light emitting device (300) with electrode pads (301, 302) respectively formed on the top and bottom thereof is mounted on a substrate (200) with a conductive pad (210) formed thereon (FIG. 7a).

Thereafter, a light transmitting material film (400) surrounding the conductive pad (210) and the light emitting device (300) is formed while exposing a portion of each of the conductive pad (210) and the electrode pad (301) formed on the top of the light emitting device (300) (FIG. 7b).

As will be described later, the light transmitting material film (400) is formed by performing a process of coating a light transmitting material on the conductive pad (210) and the light emitting device (300) to form a film and selectively removing the film to expose the portions of the conductive pad (210) and the electrode pad (301) formed on the top of the light emitting device (300).

Subsequently, the conductive line (500) is formed along a surface of the light transmitting material film (400) from the exposed portion of the conductive pad (210) to the exposed portion of the electrode pad (301) of the light emitting device (300) (FIG. 7c).

Here, the conductive line (500) is formed when the exposed portions of the conductive pad (210) and the electrode pad (301) formed on the top of the light emitting device (300) are connected to each other using a conductive material.

The conductive line (500) should make a connection with a uniform thickness to decrease tolerance in view of internal resistance or the like.

Therefore, the conductive pad (210) and the electrode pad (301) of the light emitting device (300) are connected to each other using the conductive material through a lift-off or hard mask technique.

In the lift-off technique, when the light transmitting material film (400) is made of a photosensitive material and the light transmitting material film (400) is selectively etched using an appropriate liquid solution after a conductive material has been deposited on the light transmitting material film (400), the conductive material in which the light transmitting material film (400) has been etched is lifted off and removed.

Therefore, the conductive pad (210) and the electrode pad (301) of the light emitting device (300) are connected to each other through the conductive material by means of the lift-off technique.

Further, in the hard mask technique, a fixed frame is formed to connect the conductive pad (210) and the electrode pad (301) of the light emitting device (300) to each other through a conductive material, and the conductive material is then sprayed onto the formed frame.

Therefore, the conductive pad (210) and the electrode pad (301) of the light emitting device (300) are connected to each other through the conductive material by means of the spraying.

Figure 8A:
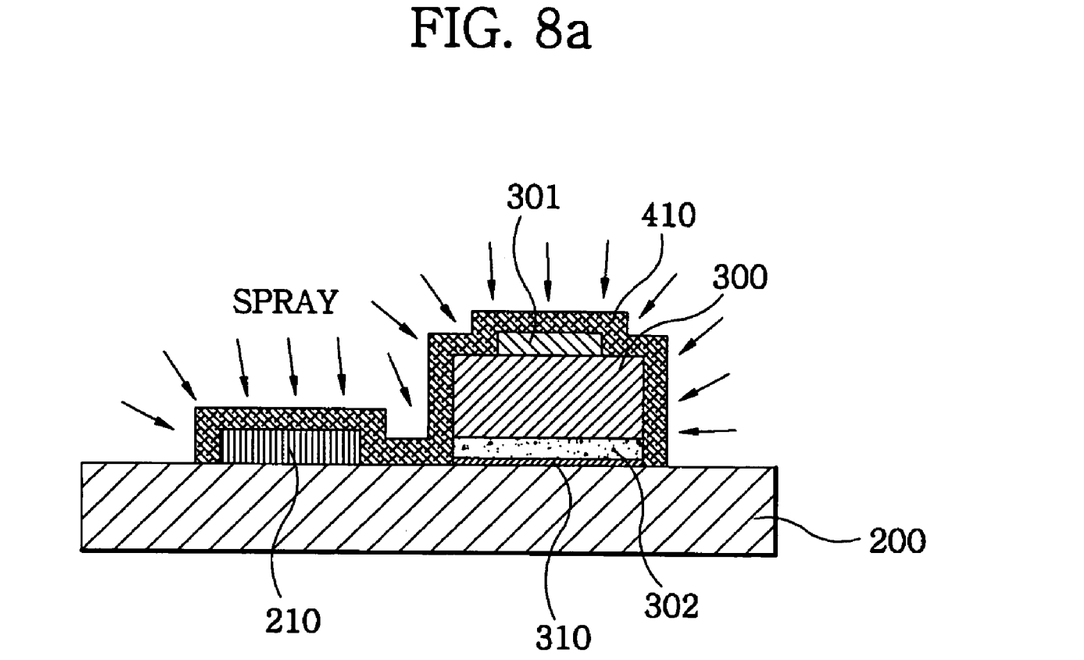
FIGS. 8a and 8b are sectional views illustrating an example of a process of forming a light transmitting material film in accordance with the present invention.
Figure 8B:
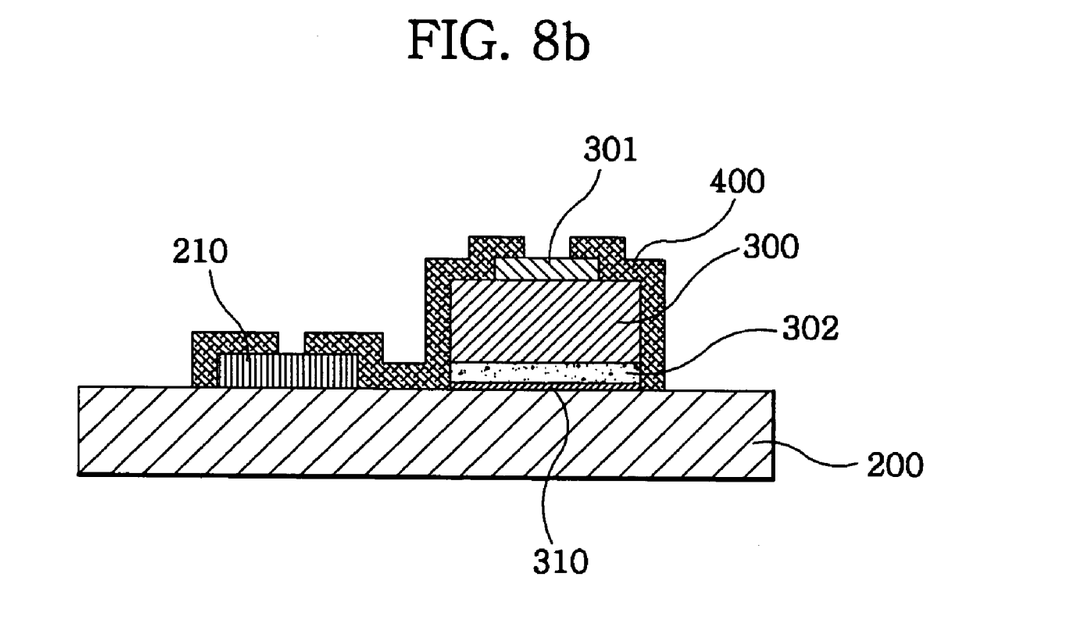

FIGS. 8a and 8b are sectional views illustrating an example of a process of forming a light transmitting material film in accordance with the present invention. To form the light transmitting material film (400) as shown in FIG. 7b, a light transmitting material is first coated on a substrate (200) while surrounding the conductive pad (210) and the light emitting device (300).

A film formed through coating of a light transmitting material is defined as a coating film (410).

Further, when the light transmitting material is coated, a spray coating technique is used as shown in FIG. 8a.

The spray coating technique is a technique capable of performing uniform coating in a case where there is a large step in a substrate.

That is, when the light emitting device (300) is bonded to the substrate (200), the height of a portion of the substrate to which the light emitting device (300) is bonded is remarkably high as compared with that of a portion of the substrate to which the light emitting device (300) is not bonded.

Therefore, although it is considerably difficult to uniformly coat the light transmitting material on an entire surface of the substrate (200), the spray coating technique enables the light transmitting material to be coated with a uniform thickness on a structure where there is a large step therein, thereby reducing tolerance in view of internal resistance.

Thereafter, the coating film (410) is patterned to expose a portion of each of the conductive pad (210) and the electrode pad (301) formed on the top of the light emitting device (300) (FIG. 8b).

Thus, the light transmitting material film (400) shown in FIG. 7b is formed through the processes of FIGS. 8a and 8b.

Meanwhile, the patterning is preferably made through a photolithography process.

At this time, if the light transmitting material film (400) is a photosensitive material, the photolithography process can be more easily performed.

For example, a mask is formed on an upper surface of the photosensitive material and light is radiated thereon. Then, a portion of the photosensitive material on which light is radiated or not radiated can be easily removed using a substance of acetone or the like in accordance with the property of the photosensitive material.

That is, the portions of the conductive pad (210) and the electrode pad (301) of the light emitting device (300) are exposed by means of the etching.

Figure 9A:
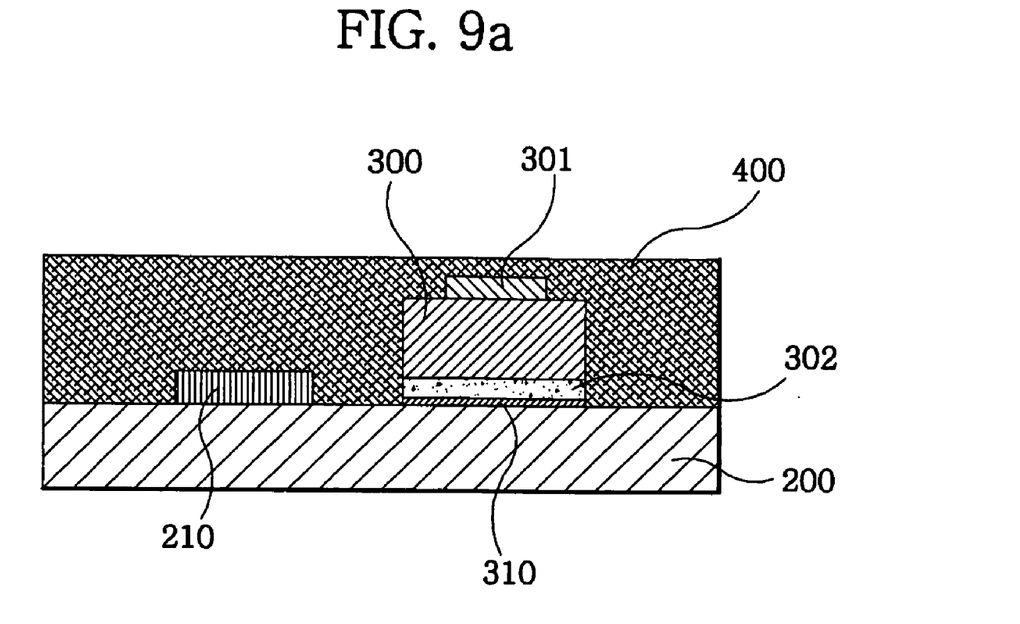
FIGS. 9a and 9b are sectional views illustrating another example of a process of forming a light transmitting material film in accordance with the present invention.
Figure 9B:
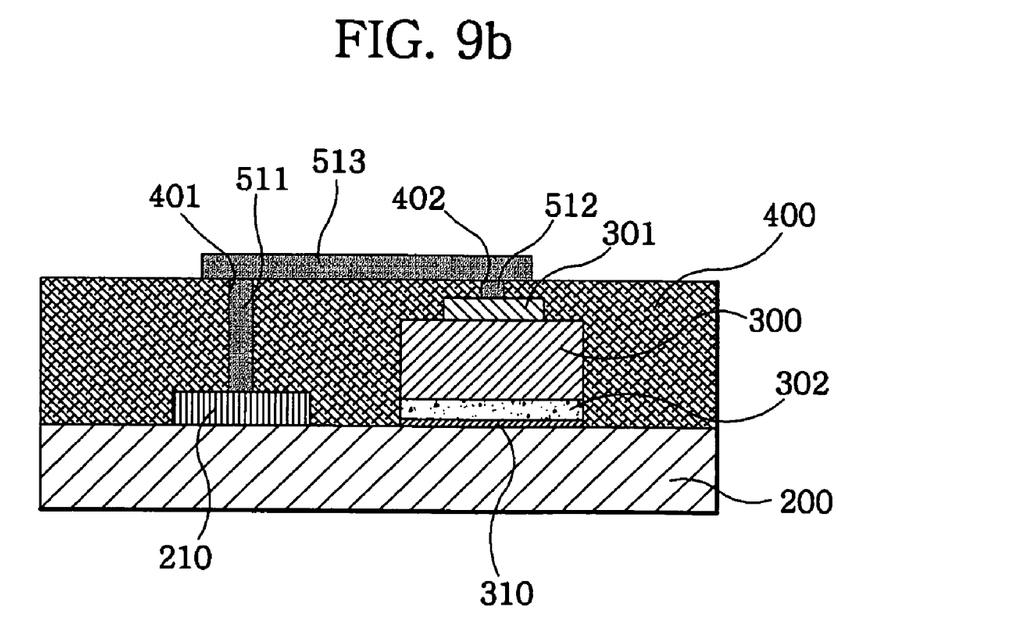

FIGS. 9a and 9b are sectional views illustrating another example of a process of forming a light transmitting material film in accordance with the present invention. A light transmitting material film may be formed according to the shapes of a conductive pad and a light emitting device as shown in FIG. 8a. Otherwise, a flat film of which the top is flattened is formed while surrounding the conductive pad (210) and the light emitting device (300), thereby facilitating formation of a conductive line.

That is, in this method, after the process of FIG. 7a, the light transmitting material film (420) of which the top is flattened and which surrounds the conductive pad (210) and the light emitting device (300) is formed (FIG. 9a).

Then, a pair of trenches (401, 402) are formed by removing portions of the light transmitting material film (400) from the top of the light transmitting material film (400) to the conductive pad (210) and the electrode pad (301) of the light emitting device (300), conductive materials (511, 512) are respectively filled in the pair of trenches (401, 402), and a process of forming a conductive layer (513) connecting the conductive materials (511, 512) is performed (FIG. 9b).

Thus, the conductive line comprises the conductive materials (511, 512) respectively filled in the pair of trenches (401, 402), which have been formed by removing the portions of the light transmitting material film (400) from the top of the light transmitting material film (400) to the conductive pad (210) and the electrode pad (301) of the light emitting device (300); and the conductive layer (513) formed on the light transmitting material film (400) to connect the conductive materials (511, 512) to each other filled in the pair of trenches (401, 402).

Figure 10:
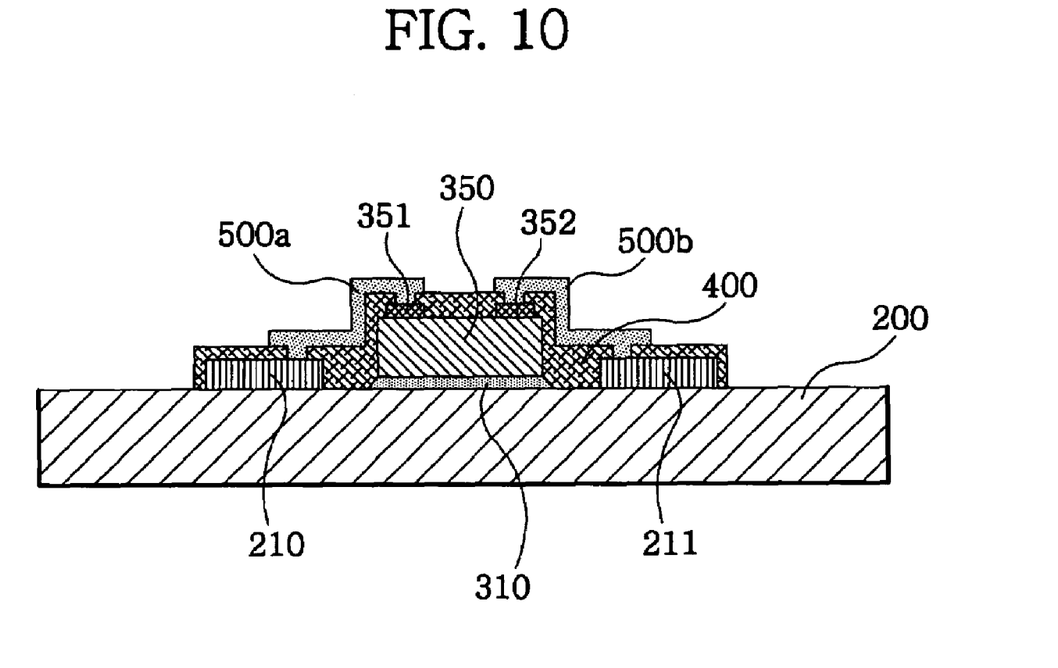
FIG. 10 is a schematic sectional view of a light emitting device package according to a second embodiment of the present invention.

FIG. 10 is a schematic sectional view of a light emitting device package according to a second embodiment of the present invention. The light emitting device package of the second embodiment comprises a substrate (200) with a pair of conductive pads (210, 211) formed thereon; a light emitting device (350) mounted on the top of the substrate (200) and having a pair of electrode pads (351, 352) formed thereon; a light transmitting material film (400) for surrounding the conductive pads (210, 211) and the light emitting device (350) while exposing portions of the pair of conductive pads (210, 211) and portions of the pair of electrode pads (351, 352); and a pair of conductive lines (500a, 500b) formed along a surface of the light transmitting material film (400) from the exposed portions of the pair of conductive pads (210, 211) to the exposed portions of the pair of electrode pads (351, 352), respectively.

Here, if the substrate (200) is a conductive substrate, an insulation film is interposed between the conductive pads (210, 211) and the substrate (200).

Further, it is preferred that the light emitting device (350) be a green or blue light emitting device.

Figure 11A:
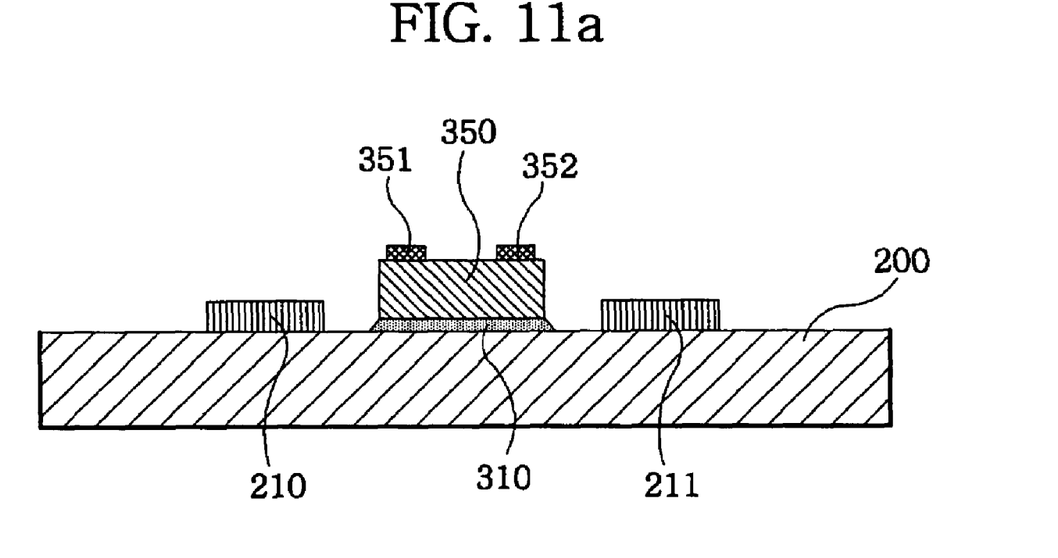
FIGS. 11a to 11c are sectional views illustrating a process of manufacturing the light emitting device package according to the second embodiment of the present invention.
Figure 11B:
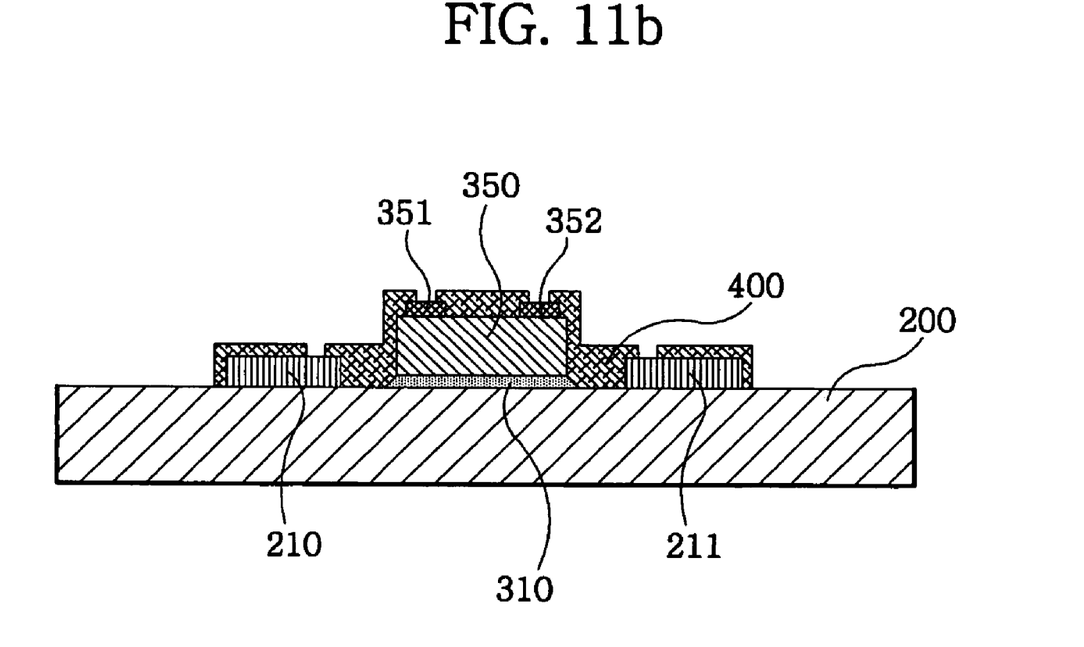
Figure 11C:
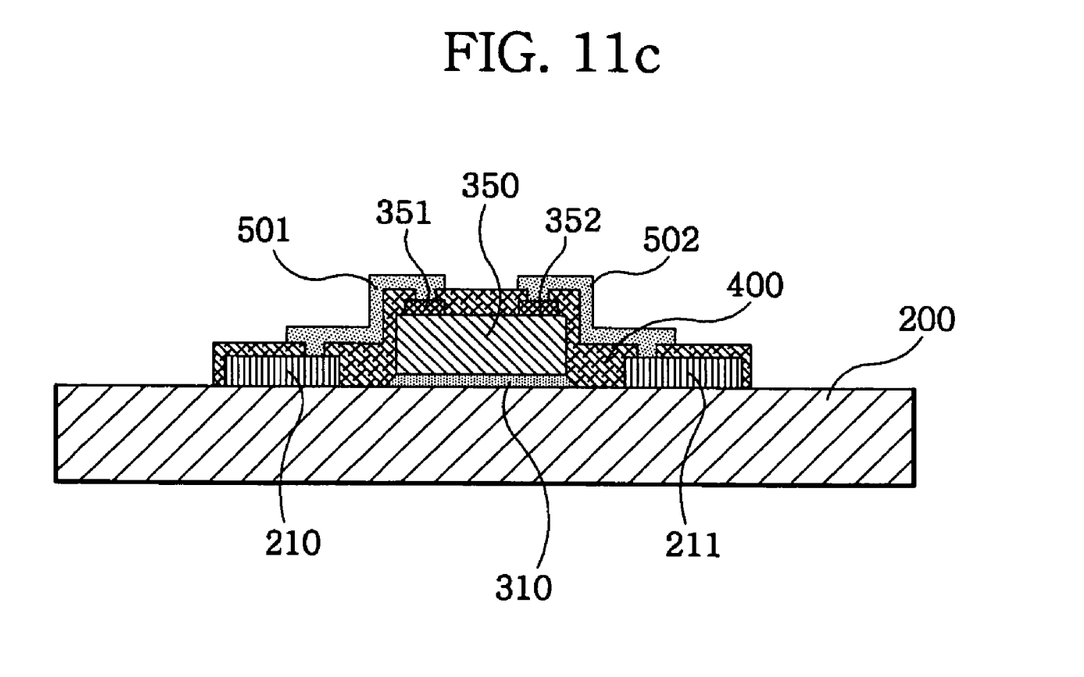

FIGS. 11a to 11c are sectional views illustrating a process of manufacturing the light emitting device package according to the second embodiment of the present invention. As shown in FIG. 11a, a light emitting device (350) with a pair of electrode pads (351, 352) formed thereon is bonded to the top of a substrate (200) with a pair of conductive pads (210, 211) thereon.

Then, a light transmitting material film (400) surrounding the conductive pads (210, 211) and the light emitting device (350) is formed while exposing portions of the pair of conductive pads (210, 211) and portions of the pair of electrode pads (351, 352) (FIG. 11b).

Finally, a pair of conductive lines (501, 502) are formed along a surface of the light transmitting material film (400) from the exposed portions of the pair of conductive pads (210, 211) to the exposed portions of the pair of electrode pads (351, 352), respectively (FIG. 11c).

Figure 12:
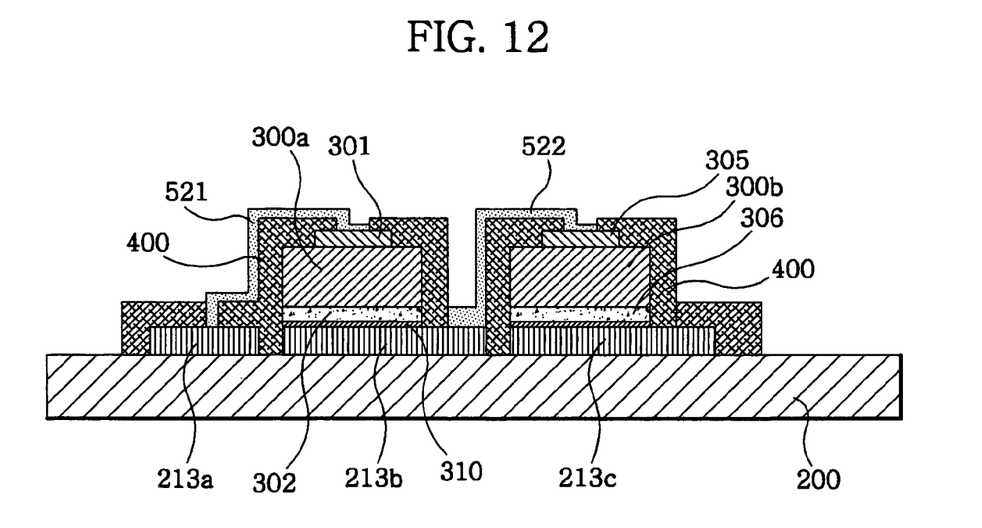
FIG. 12 is a sectional view showing a state where light emitting devices are arrayed and packaged according to the present invention.

FIG. 12 is a sectional view showing a state where light emitting devices are arrayed and packaged according to the present invention. A plurality of light emitting devices (300a, 300b) with electrode pads (301, 302; 305, 306) formed respectively on the top and bottom thereof are bonded to correspond to a plurality of conductive pads (213b, 213c).

At this time, the light emitting devices (300a, 300b) are not bonded to a conductive pad (213a), and a light transmitting material film (400) surrounds the conductive pads (213a, 213b, 213c) and the light emitting devices (300a, 300b) while exposing portions of the conductive pads (213a, 213b, 213c) and the electrode pads (301, 305) formed respectively on the tops of the light emitting devices (300a, 300b).

Further, a conductive line (521) for connecting the conductive pad (213a) to which the light emitting devices (300a, 300b) are not bonded to the electrode pad (301) of the light emitting device (300a) adjacent thereto is formed along a surface of the light transmitting material film (400), and a conductive line (522) for connecting the electrode pad (213b) with the light emitting device (300a) bonded thereto to the electrode pad (305) of the other light emitting device (300b) is formed along a surface of the light transmitting material film (400).

Therefore, it is possible to implement a package in which two light emitting devices are connected in parallel without using a wire bonding technique.

Figure 13:
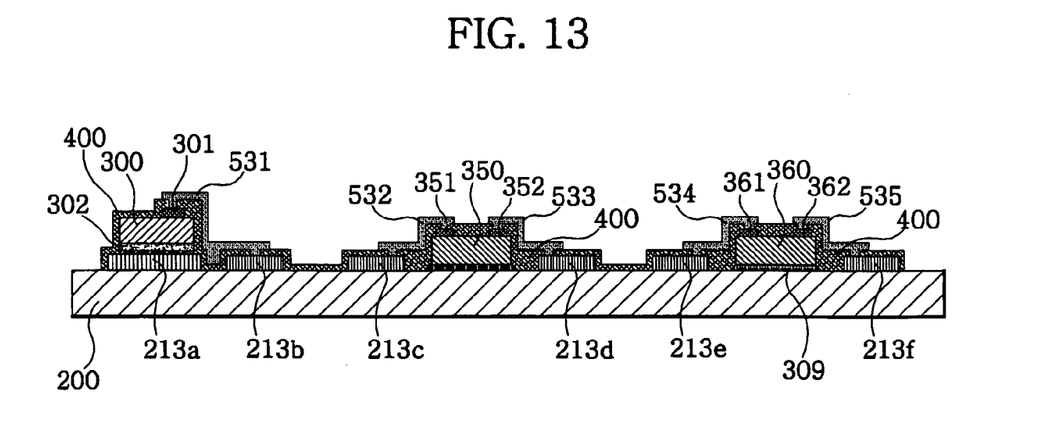
FIG. 13 is a sectional view of a package for implementing a white light source by arraying light emitting devices in accordance with the present invention.

FIG. 13 is a sectional view of a package for implementing a white light source by arraying light emitting devices in accordance with the present invention. One light emitting device (300) with electrode pads (301, 302) formed respectively on the top and bottom thereof is packaged on a substrate (200) in the same manner as the first embodiment.

Further, two light emitting devices (350, 360) each of which has a pair of electrode pads (351, 352; 361, 362) formed thereon are packaged in the same manner as the second embodiment.

The light emitting device 300 with the electrode pads (301, 302) formed respectively on the top and bottom thereof is a red light emitting device, and the light emitting devices (350, 360) each of which has the pair of electrode pads (351, 352; 361, 362) formed thereon are green and blue light emitting devices.

Thus, it is possible to implement a package capable of emitting white light, wherein red, green and blue light emitting devices are mounted on a substrate and these light emitting devices are electrically connected to one another without wire bonding.

Figure 14:
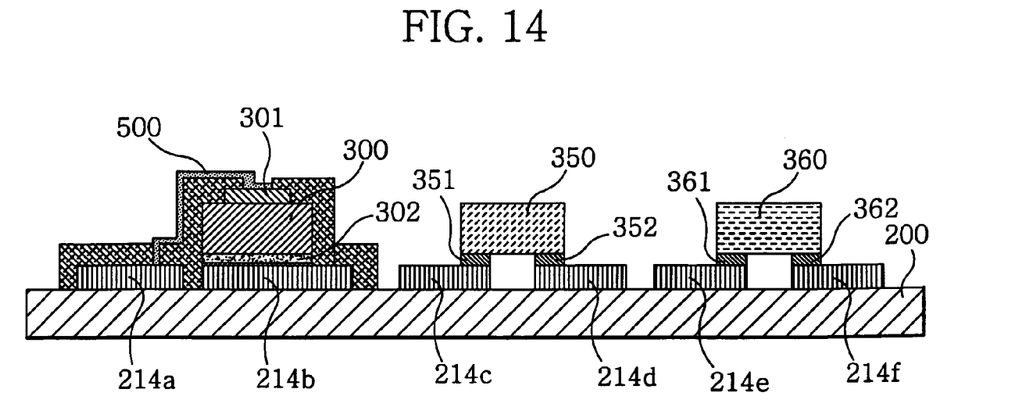
FIG. 14 is a sectional view of another package for implementing a white light source by arraying light emitting devices in accordance with the present invention.

FIG. 14 is a sectional view of another package for implementing a white light source by arraying light emitting devices in accordance with the present invention. Six conductive pads (214a, 214b, 214c, 214d, 214e, 214f) are formed on a substrate (200), and a light emitting device (300) with electrode pads (301, 302) formed respectively on the top and bottom thereof is mounted on the substrate (200) using the two conductive pads (214a, 214b) and then packaged without wire bonding.

Two light emitting devices (350, 360) each of which has a pair of electrode pads (351, 352; 361, 362) formed on the bottom thereof are flip-chip boned to the remaining four conductive pads (214c, 214d, 214e, 214f).

As described above, the present invention has advantages in that a light emitting device is electrically connected to other devices without use of wire bonding, thereby saving a space for wire bonding and reducing the size of a package.

Further, the present invention has an advantage in that a short or disconnection caused by wire bonding is reduced, resulting in improved reliability of a package.

Furthermore, there are advantages in that a light transmitting material film is coated on a substrate with a light emitting device mounted thereon so that an additional passivation film capable of protecting the light emitting device cannot be required, and wire bonding is not required so that manufacturing costs can be reduced and mass production can be made.

Although the present invention has been described in detail in connection with the specific embodiments, it will be readily apparent to those skilled in the art that various modifications and changes can be made thereto within the technical spirit and scope of the present invention. It is also apparent that the modifications and changes fall within the scope of the present invention defined by the appended claims.

What is claimed is:

1. A light emitting device package, comprising:
    a substrate formed thereon with a first and a second conductive pad;
    a light emitting device having electrode pads formed on the top and bottom of the light emitting device, wherein the electrode pad formed on the bottom of the light emitting device is bonded to the first conductive pad;
    a light transmitting material film surrounding the second conductive pad and the light emitting device, exposing a portion of each of the conductive pad and the electrode pad formed on the top of the light emitting device, and made of photosensitive substance through which light can be transmitted; and
    a conductive line formed along a surface of the light transmitting material film from the exposed portion of the second conductive pad to the exposed portion of the electrode pad formed on the top of the light emitting device.

2. The light emitting device package as claimed in claim 1, wherein the substrate is a conductive substrate, and
an insulation film is further interposed between the conductive pad and the conductive substrate.

3. The light emitting device package as claimed in claim 1, wherein the light emitting device is a device emitting red or infrared rays.

4. The light emitting device package as claimed in claim 1, wherein a phosphor for converting the wavelength of light emitted from the light emitting device is dispersed in the light transmitting material film.

5. The light emitting device package as claimed in claim 1, wherein the light transmitting material film is formed to conform to the shapes of the conductive pad and the light emitting device.

6. The light emitting device package as claimed in claim 1, wherein the light transmitting material film has a flat upper portion and surrounds the conductive pad and the light emitting device, and
the conductive line comprises:
a conductive material filled in a pair of trenches formed by removing portions of the light transmitting material film from the top of the light transmitting material film respectively to the conductive pad and the electrode pad of the light emitting device, and
a conductive layer formed on the top of the light transmitting material film to connect the conductive material filled in the pair of trenches to each other.

7. The light emitting device package as claimed in claim 1, wherein the light transmitting material film is formed on a region located at the shortest distance from the conductive pad to the electrode pad.

8. The light emitting device package as claimed in claim 1, wherein the light transmitting material film is partially formed only on a region of the light emitting device, and the light emitting device package is further provided with a phosphor film for surrounding the light transmitting material film and the light emitting device.

9. A light emitting device package, comprising:
a substrate with a pair of conductive pads formed thereon;
a light emitting device mounted on the substrate and having a pair of electrode pads formed on the top of the light emitting device;
a light transmitting material film surrounding the conductive pads and the light emitting device, exposing a portion of each of the pair of conductive pads and a portion of each of the pair of electrode pads, and made of photosensitive substance through which light can be transmitted; and
a pair of conductive lines formed along a surface of the light transmitting material film from the exposed portion of each of the pair of conductive pads to the exposed portion of each of the pair of electrode pads.

10. The light emitting device package as claimed in claim 9, wherein the light emitting device is a green or blue light emitting device.

11. A method for manufacturing a light emitting device package, comprising the steps of:
bonding an electrode pad formed on the bottom of a light emitting device having electrode pads formed at the top and bottom of the light emitting device to a first conductive pad of a substrate formed thereon with the first and a second conductive pad;
forming a light transmitting material film surrounding the conductive pad and the light emitting device, exposing a portion of each of the second conductive pad and the electrode pad formed on the top of the light emitting device, and made of photosensitive substance through which light can be transmitted; and
forming a conductive line formed along a surface of the light transmitting material film from the exposed portion of the second conductive pad to the exposed portion of the electrode pad of the light emitting device.

12. The method as claimed in claim 11, wherein the light transmitting material film is formed by coating a light transmitting material on the conductive pad and the light emitting device to form a film and selectively removing the film to expose a portion of each of the conductive pad and the electrode pad formed on the top of the light emitting device.

13. The method as claimed in claim 12, wherein the film is formed by means of a spray coating method.

14. The method as claimed in claim 11, wherein the step of forming the light transmitting material film comprises the steps of:
forming a flat film having a flat upper portion and surrounding the conductive pad and the light emitting device;
forming a pair of trenches by removing portions of the flat film from the top of the flat film respectively to the conductive pad and the electrode pad of the light emitting device; and
filling the pair of trenches with a conductive material and forming a conductive layer for connecting the conductive material filled in the trenches to each other.

15. The method as claimed in claim 11, wherein a phosphor for converting the wavelength of light emitted from the light emitting device is dispersed in the light transmitting material film.

16. The method as claimed in claim 11, wherein the conductive line is formed by performing a lift-off process or a hard mask process.

17. A method for manufacturing a light emitting device package, comprising the steps of:
bonding a light emitting device formed with a pair of electrode pads to a substrate with a pair of conductive pads formed thereon;
forming a light transmitting material film surrounding the conductive pads and the light emitting device, while exposing a portion of each of the pair of conductive pads and a portion of each of the pair of electrode pads, and made of photosensitive substance through which light can be transmitted; and
forming a pair of conductive lines formed along a surface of the light transmitting material film from the exposed portion of each of the pair of conductive pads to the exposed portion of each of the pair of electrode pads.

* * * * *